US008519467B2

(12) United States Patent
Endo et al.

(10) Patent No.: US 8,519,467 B2
(45) Date of Patent: Aug. 27, 2013

(54) SEMICONDUCTOR DEVICE

(75) Inventors: Masato Endo, Yokohama (JP);
Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 314 days.

(21) Appl. No.: 13/051,516

(22) Filed: Mar. 18, 2011

(65) Prior Publication Data

US 2011/0309422 A1    Dec. 22, 2011

(30) Foreign Application Priority Data

Jun. 22, 2010   (JP) .................................. 2010-141897

(51) Int. Cl.
*H01L 27/06* (2006.01)

(52) U.S. Cl.
USPC .... 257/316; 257/380; 257/536; 257/E27.016; 438/257; 438/382

(58) Field of Classification Search
USPC .................. 257/314–326, 536–543, E21.422, 257/E27.016, E29.3–E29.308; 438/257–267, 438/382–385
See application file for complete search history.

(56) References Cited

U.S. PATENT DOCUMENTS

2002/0036317 A1   3/2002  Matsui et al.
2006/0220003 A1*  10/2006 Noguchi et al. ................ 257/22

FOREIGN PATENT DOCUMENTS

JP          2010-73812       4/2010

* cited by examiner

*Primary Examiner* — Julio J Maldonado
*Assistant Examiner* — Daniel Shook
(74) *Attorney, Agent, or Firm* — Oblon, Spivak, McClelland, Maier & Neustadt, L.L.P.

(57) ABSTRACT

According to one embodiment, a semiconductor device includes a first resistance element including a first conductive material, an inter-gate insulation film formed on both ends of the first conductive material in a first direction, and a second conductive material formed above the first conductive material and configured to connect with the first conductive material via a first connection region from which the inter-gate insulation film is removed, and a second resistance element including a third conductive material, the inter-gate insulation film formed on both ends of the third conductive material in the first direction, and a fourth conductive material formed above the third conductive material and configured to connect with the third conductive material via a second connection region from which the inter-gate insulation film is removed, wherein a length of the second connection region is greater than a length of the first connection region in the first direction.

13 Claims, 11 Drawing Sheets

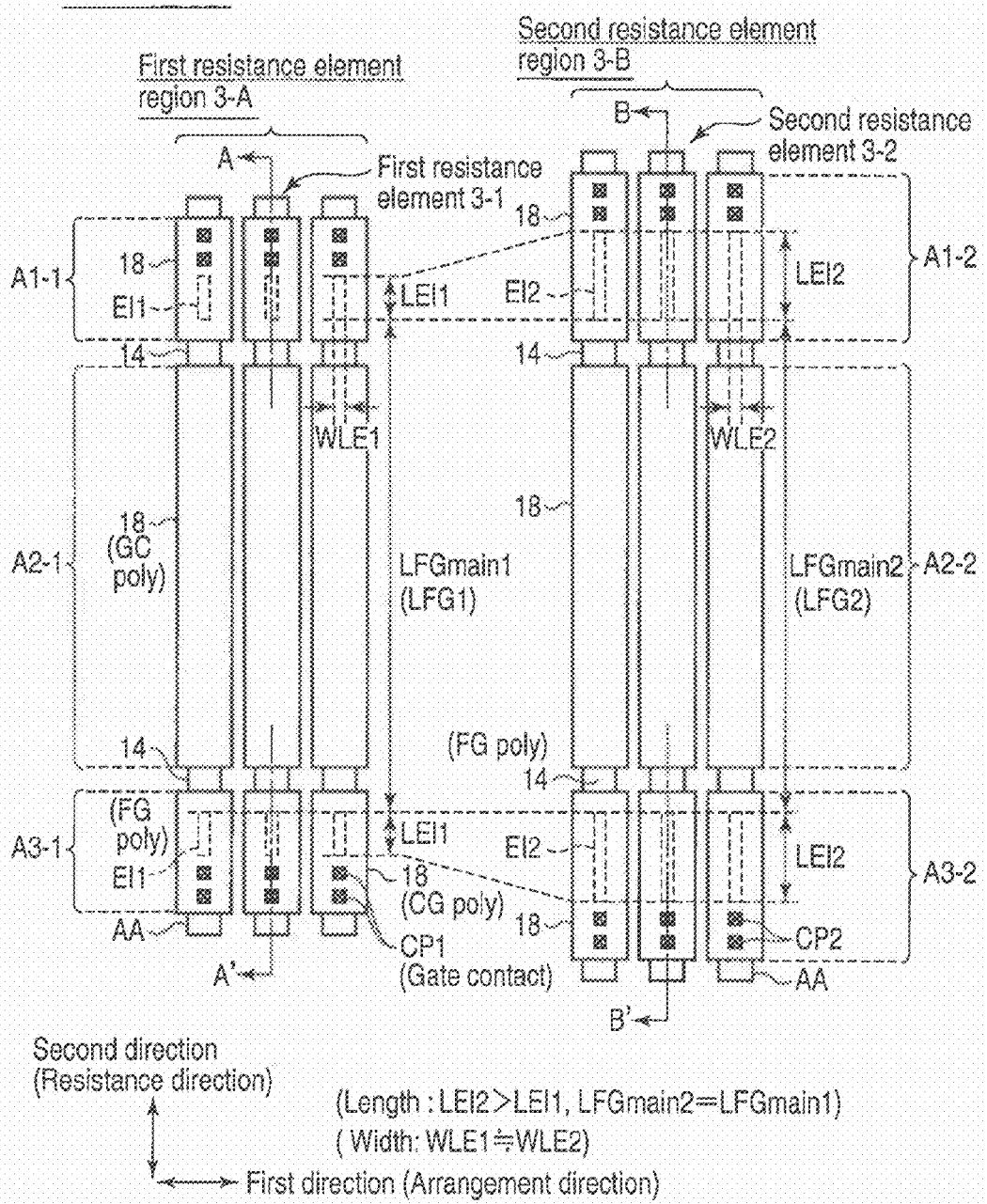
F I G. 1

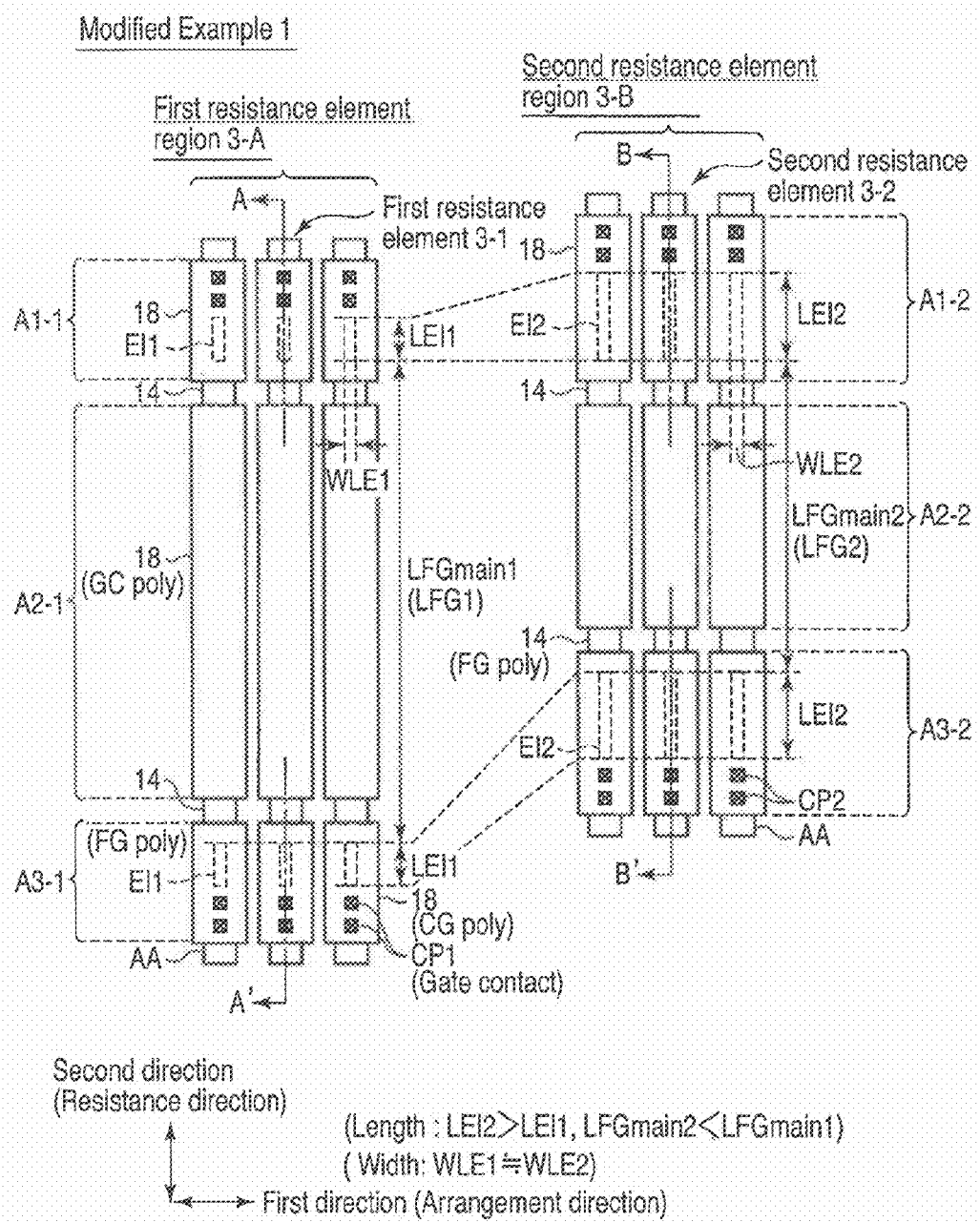
F I G. 3

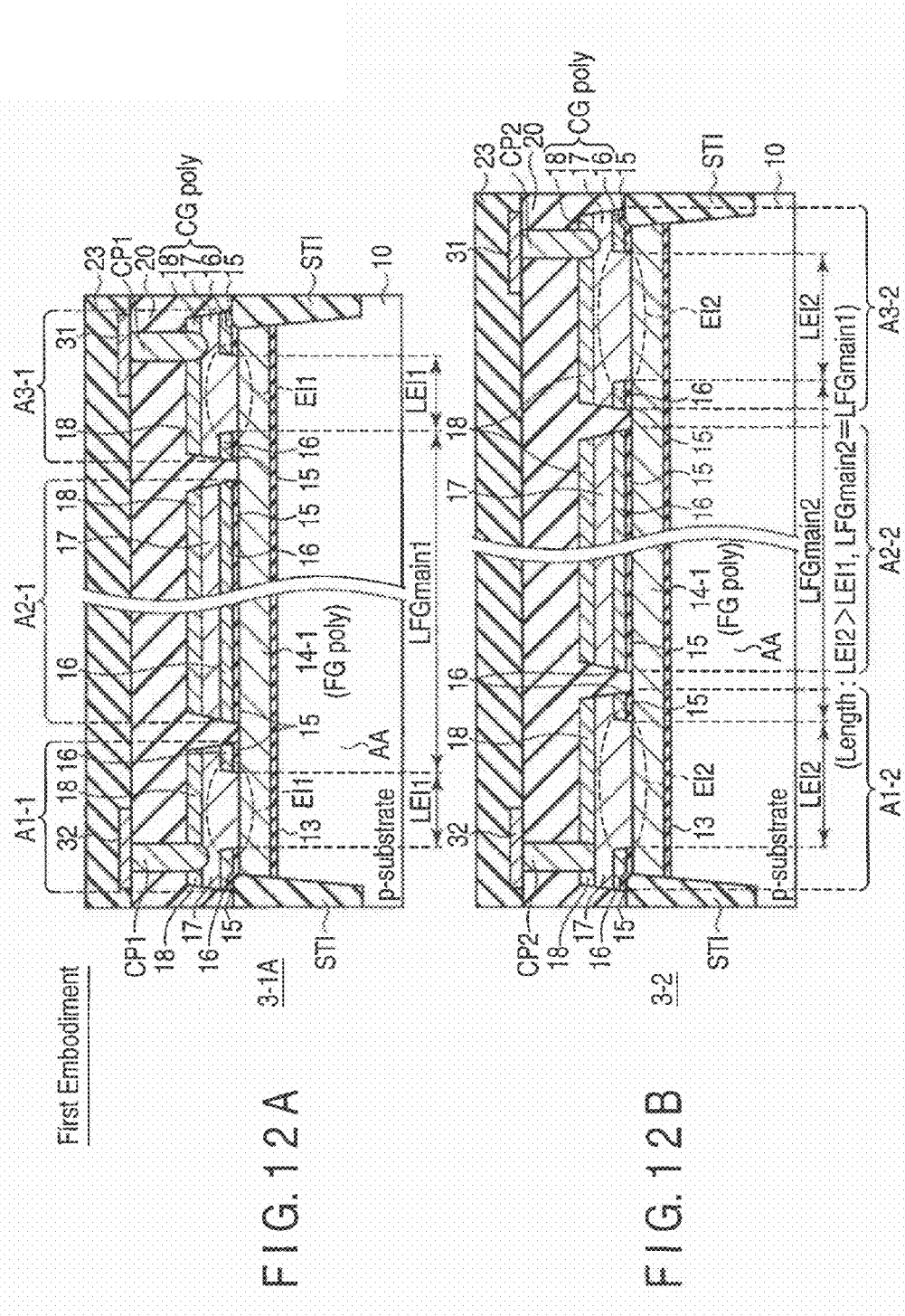

SEMICONDUCTOR DEVICE

CROSS-REFERENCE TO RELATED APPLICATIONS

This application is based upon and claims the benefit of priority from Japanese Patent Application No. 2010-141897, filed Jun. 22, 2010; the entire contents of which are incorporated herein by reference.

FIELD

Embodiments described herein relate generally to a semiconductor device.

BACKGROUND

The known non-volatile semiconductor devices include electrically erasable and programmable read-only memory (EEPROM), for example. A memory cell of an EEPROM usually has a MISFET structure comprising a stacked gate in which a charge storage layer and a control gate are stacked on a semiconductor substrate.

In an EEPROM, an approach of making a resistance element and a MOS transistor forming peripheral circuits configured to control the operation to have the same configuration as that of a memory cell is sometimes adopted (Jpn. Pat. Appln. KOKAI Publication No. 2010-073812, for example). In a resistance element, for example, a conductive layer that is to be a charge storage layer of the memory cell is used as a resistance region (FG poly), and two stacked gate structures arranged so as to interpose the resistance region are used as an electrode portion.

BRIEF DESCRIPTION OF THE DRAWINGS

FIG. 1 is a schematic plan view illustrating a plan configuration of a semiconductor device according to the brief overview;

FIG. 3 is a plan view illustrating a plan configuration of a semiconductor device according to Modified Example 1;

FIG. 12A is a cross-sectional view of a first resistance element, viewed along second direction in FIG. 10; and FIG. 12B is a cross-sectional view of a second resistance element viewed from second direction in FIG. 10.

DETAILED DESCRIPTION

In general, according to one embodiment, a semiconductor device includes: a semiconductor substrate; a first resistance element including a first conductive material provided on the semiconductor substrate, an inter-gate insulation film formed on an upper surface of both ends of the first conductive material in a first direction, and a second conductive material formed above the first conductive material and configured to connect with the first conductive material via a first connection region from which the inter-gate insulation film is removed; and a second resistance element including a third conductive material provided on the semiconductor substrate, the inter-gate insulation film formed on an upper surface of both ends of the third conductive material in the first direction, and a fourth conductive material formed above the third conductive material and configured to connect with the third conductive material via a second connection region from which the inter-gate insulation film is removed. A length of the second connection region is greater than a length of the first connection region in the first direction.

When the resistance value of the above-described resistance element is determined, the above-described resistance element, the size of the resistance value is varied by varying the number of resistance regions (FG poly) connected in series or connected in parallel, for example. Further, variation in resistance of the resistance element is approximately determined based on variation in resistance value of the resistance region.

More specifically, the resistance element is configured such that connection regions (EI resistance portions) from which the inter-gate insulation film has been removed are electrically connected in series in two stacked-gate structures arranged so as to interpose a resistance material therebetween.

In recent years, however, the resistance value of the connection region (EI resistance portion) and variation in resistance are becoming increasingly negligible in the resistance region (main portion) of the resistance element due to the effect of shrinking caused by miniaturization of the semiconductor device and the film thickness, for example, of the element. Accordingly, there is an increasing tendency that the resistance value of the connection region (EI resistance portion) and variation in resistance need to be considered.

Hereinafter, embodiments will be described in detail with reference to the accompanying drawings. In the descriptions that follow, the common structural elements will be referred to by the common referential marks throughout the drawings.

[Brief Overview]

A brief overview of the semiconductor device according to the present example will be described with reference to FIGS. 1 and 2.

CONFIGURATION EXAMPLE

Figures 2A, 2B:
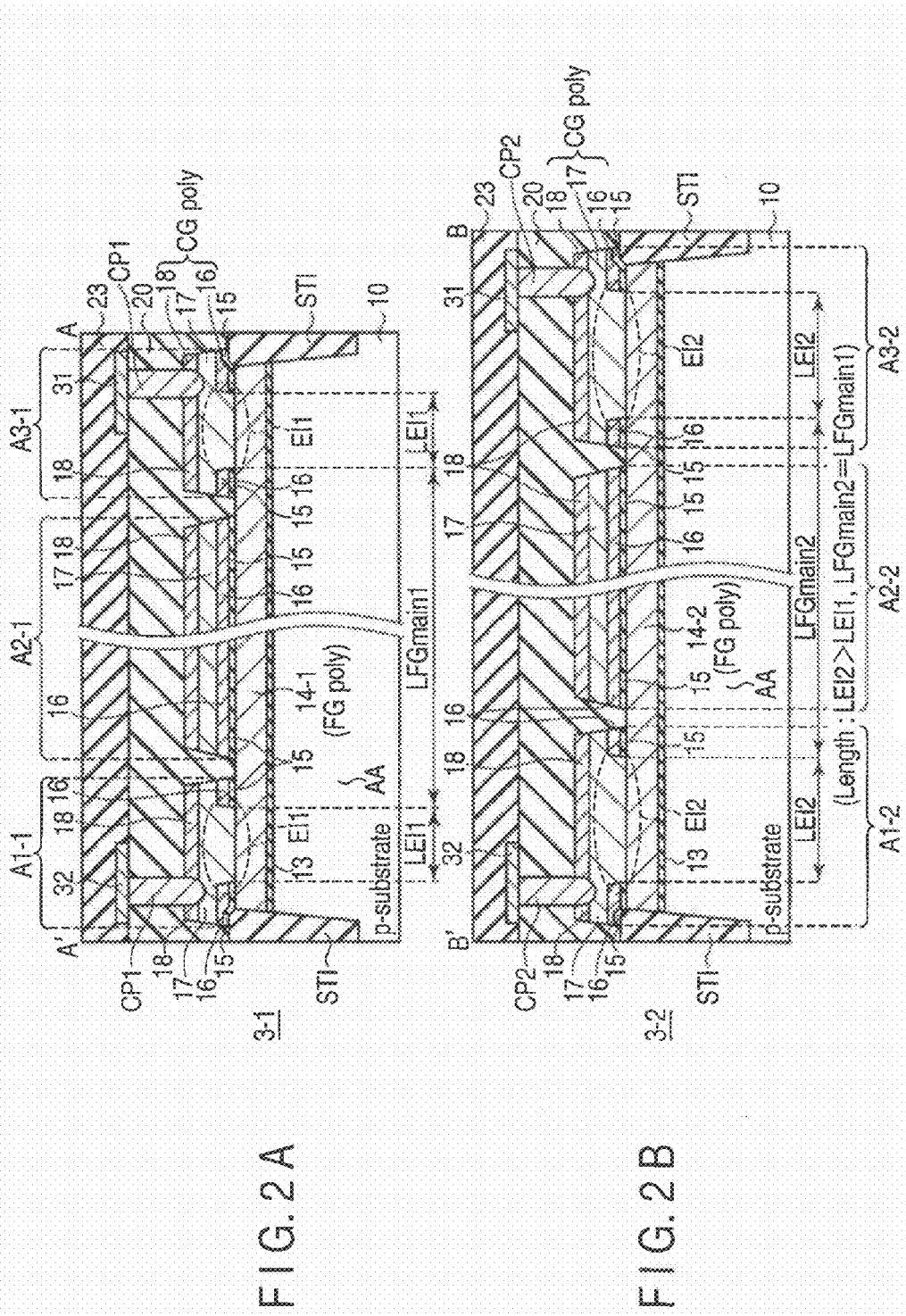
FIG. 2A is a cross-sectional view along line A-A' of FIG. 1 viewed from the arrow direction.
FIG. 2B is a cross-sectional view along line B-B' of FIG. 1 viewed from the arrow direction.

FIG. 1 is a plan view illustrating a configuration example of a semiconductor device according to the brief overview. FIG. 2A and FIG. 2B are cross-sectional views taken from lines A-A' and B-B', respectively, of FIG. 1, viewed along the arrow direction.

According to the brief overview, a semiconductor device comprising a resistance element with a precise resistance value is provided.

As shown in FIG. 1 and FIGS. 2A and 2B, a first resistance element formation region 3-A and a second resistance element formation region 3-B are provided. In a top surface of a semiconductor substrate 10 of each region, a plurality of striped element regions AA are formed along second direction. In the periphery of the element region AA, an element separation region STI is formed. The element separation region STI is formed of a groove formed in the top surface of the semiconductor substrate 10 and an insulation film embedded in the groove.

In each region, a first resistance element 3-1 and a second resistance element 3-2 are formed on the element region AA. FIG. 1 shows three first resistance elements 3-1 and three second resistance elements 3-2 arranged at predetermined intervals in a first direction. The second direction refers to the direction in which the first and second resistance elements 3-1, 3-2 extend, i.e., the direction in which a current flows through the first and second resistance elements 3-1, 3-2.

On each of the element regions AA, a polycrystalline silicon layer 14 is formed via a gate insulation film 13. On the polycrystalline silicon layer 14, polycrystalline silicon layers 16, 17 and a silicide layer 18 are sequentially formed via an inter-gate insulation film 15. It is to be noted that the polycrystalline silicon layer 14 in the first resistance element may be referred to as a first conductive material 14-1, and the polycrystalline silicon layer 14 in the second resistance element may be referred to as a first conductive material 14-2.

As described above, in each of the element regions AA, the inter-gate insulation film 15, the polycrystalline silicon layers 16, 17, and the silicide layer 18 are divided into three sections along the second direction (see FIG. 1). For example, in the first resistance element 3-1, a groove is formed between the regions A1-1 and A2-1 and between the regions A2-1 and A3-1, after the polycrystalline silicon layers 16, 17 and the silicide layer 18 are removed. Similarly, in the second resistance element 3-2, a groove is formed between the regions A1-2 and A2-2 and the regions A2-2 and A3-2, after the polycrystalline silicon layers 16, 17 and the silicide layer 18 are removed. Further, while the upper surface of the element separation region STI is formed up to a height greater than the upper surface of the polycrystalline silicon layer 14 in FIG. 2, the upper surface of the element separation region STI may be formed at a height smaller than the upper surface of the polycrystalline silicon layer 14.

A first connection portion EI1 is formed in regions A1-1 and A3-1. In the first connection portion EI1, an opening portion is formed after part of the inter-gate insulation film 15 and the polycrystalline silicon layer 16 is removed, and thereby the polycrystalline silicon layer 14 and the polycrystalline silicon layer 17 are connected. Similarly, a second connection portion EI2 is formed in regions A1-2 and A3-2. In the second connection portion EI2, an opening portion is formed after part of the inter-gate insulation film 15 and the polycrystalline silicon layer 16 is removed, and thereby the polycrystalline silicon layer 14 and the polycrystalline silicon layer 17 are connected. In this case, a length LEI2 of the second connection region along the second direction is greater than a length LEI1 of the first connection region (LEI2>LEI1). A width WEI2 of the first connection region along the first direction is approximately the same as a width WEI1 of the first connection region (WEI2≈WEI1).

Further, an interlayer insulation film 20 is formed on the semiconductor substrate 10 so as to coat the resistance elements 3-1, 3-2. In the interlayer insulation film 20, a contact plug CP1 is formed so as to reach the silicide layer 18 in the regions A1-1, A3-1, and a contact plug CP2 is formed so as to reach the silicide layer 18 in the regions A1-2, A3-2. Metal wiring layers 31, 32 are formed on the inter-layer insulation film 20. The metal wiring layer 31 is connected to contact plugs CP1, CP2 in the regions A3-1, A3-2, and the metal wiring layer 32 is connected to contact plugs CP1, CP2 in the regions A1-1, A1-2.

In the above-described configuration, the regions in which the polycrystalline silicon layer 14 substantially functions as a resistance in the resistance element will be referred to as a first resistance region LFG1 and a second resistance region LFG2. More specifically, the first resistance region LFG1 is a region extending from an end portion of the first connection region EI1 on the side of the region A2-1 in the region A1-1 to an end portion of the first connection region EI1 on the side of the region A2-1 in the region A3-1, with respect to the second direction.

The polycrystalline silicon layers 16, 17 and the silicide layer 18 in the regions A1-1, A1-2, A3-1, and A3-2 function as electrodes in the resistance element. The polycrystalline silicon layers 14, 16, 17 and the silicide layer 18 may be any conductive layers, but may also be formed of a material same as that of a memory cell array, which will be described later.

That is, an exemplary configuration of the semiconductor device of the present embodiment comprises: a first resistance element 3-1 including a first conductive material 14-1, an inter-gate insulation film 15 formed on an upper surface of both ends of the first conductive material 14-1, and a second conductive material 17 configured to connect with the first conductive material 14-1 via the first connection region EI1 from which the inter-gate insulation film 15 has been removed; and a second resistance element 3-2 including a second conductive material 14-2, an inter-gate insulation film 15 formed on an upper surface of both ends of the second conductive material 14-2, and a third conductive material 17 configured to connect with the second conductive material 14-2 via the second connection region EI2 from which the inter-gate insulation film 15 has been removed, wherein a length LEI2 of the second connection region along the second direction is greater than a length LEI1 of the first connection region (LEI2>LEI1). It is to be noted that, according to the present example, the lengths of the first and second resistance regions LFG1, LFG2 of the first and second resistance elements 3-1, 3-2 along the direction (second direction) in which a current flows in the resistance region are common (equal) (LFGmain1=LFGmain2). Further, the lengths of the first and second resistance elements 3-1, 3-2 in the direction (first direction) in which the resistance element is arranged are also equal.

Advantageous Effect

According to the above-described configuration, an advantageous effect is obtained including, but not limited to the following (1):

(1) A Resistance Element Having a Precise Resistance Value is Obtained.

As described above, in the semiconductor device of the present example, the length LEI2 of the second connection region is greater than the length LEI1 of the first connection region (LEI2>LEI1). Further, the lengths of the first and second resistance elements 3-1, 3-2 in the direction (first direction) in which the resistance element is arranged are equal. In other words, the length LEI2 of the second connection region is configured to be made greater in the length direction of the resistance element than the length LEI1 of the first connection region. That is, the semiconductor device has a resistance element in which a pattern of two or more types of EI resistance portions exist.

Further, the area of the second connection region EI2 becomes greater than the area of the first connection region EI1. There is a tendency for resistance values to vary more greatly as the area of the connection region increases. That is, variation in resistance value of the second resistance element 3-2 is smaller than variation in resistance value of the first resistance element 3-1.

On the other hand, the area of the connection region is smaller in the first resistance element 3-1 than in the second resistance element 3-2. Accordingly, at the level of the resistance element, the element area of the first resistance element 3-1 is smaller than the element area of the second resistance element 3-2.

According to the above-described configuration, it is possible to reliably operate a circuit (such as a circuit that determines the reference voltage of the semiconductor device, for example) that requires small variation in resistance value using the second resistance element 3-2, and to operate a circuit that is not affected even by large variation in resistance using the first resistance element 3-1 so as to reduce the element area. Accordingly, an advantage is obtained that a resistance element can be selected depending on variation in required resistance value.

MODIFIED EXAMPLE 1

(to which a resistance element with a small resistance value is applied)

Next, a semiconductor device according to Modified Example 1 will be described with reference to FIGS. 3 and 4. Modified Example 1 is an example to which a resistance element (second resistance element 3-2 in this case) with a small resistance value is further applied. FIG. 3 is a plan view illustrating a configuration example of a semiconductor device according to Modified Example 1. In the description that follows, a detailed description of structural elements overlapping with that of the above-described brief overview will be omitted.

CONFIGURATION EXAMPLE

As shown in FIG. 3, the present example is different from the above-described brief overview of the semiconductor device in that the length LFGmain2 of the second resistance region along the resistance direction (second direction) of the first and second resistance elements 3-1, 3-2 is smaller than the length LFGmain1 of the first resistance region (LFGmain2<LFGmain1).

Thus, the second resistance element 3-2 having a smaller resistance region 14-2 is used as a resistance element with a smaller resistance value than that of the first resistance element 3-1. The configuration that the length LEI2 of the second connection region of the second resistance element 3-2 is greater than the length LEI1 of the first connection region (LEI2>LEI1) is the same as the above-described configuration.

<Relationship between Resistance Value of EI Resistance Portion and Resistance Value of FG Resistance Portion>

Next, relationship between the resistance value of only the connection region (EI resistance portion) of the resistance element and the (total) resistance value of the resistance element will be described with reference to FIG. 4. The vertical axis denotes the resistance value of the resistance element, and the lateral axis denotes the resistance value of the EI resistance portion. FIG. 4 shows the plotted results obtained by measuring a plurality of resistance elements, and the dotted line shows extrapolation of the plots.

As shown, since the resistance value of the resistance region increases as the resistance value of the EI resistance portion increases, the resistance value (EI Rc [$\Omega$]) of the first and second connection regions EI1, EI2 and the total resistance value (FG R [$\Omega$]) of the first and second resistance regions 14-1, 14-2 are proportional.

Accordingly, when the second resistance region 14-2 is small and the second resistance element 3-2 has a small resistance value, as in the present Modified Example 1, the effect of the resistance value of the second connection region EI2 on the resistance value of the second resistance region 14-2 becomes large, compared to the case of the first resistance element 3-1. In other words, in the case of the second resistance element 3-2 having a small resistance value because of the small second resistance region 14-2, the resistance value of the second connection region EI2 looks greater with respect to the whole and cannot be negligible.

As a result thereof, in a resistance element having a small resistance value, the total resistance value of the resistance element needs to be considered due to the effect of the resistance value and variation in resistance of the connection region. The resistance value of the EI resistance portion varies more greatly when the area of the connection region decreases by shrinking, for example. For example, when the length of the resistance element along the first direction is shrinked, the length of the connection region along the first direction will also decrease. Accordingly, in order to manufacture a resistance element having a small resistance value by decreasing the length of the resistance region, variation in resistance value of the resistance element will be large. Therefore, in order to manufacture a resistance element having a small resistance, resistance elements having a large resistance value need to be arranged in parallel so as to suppress variation in resistance. As a result thereof, the area of the semiconductor chip cannot be reduced.

In light of the above, in the semiconductor device according to Modified Example 1, since the second resistance region 14-2 is provided in which the length LFGmain2 of the second resistance region along the resistance direction of the resistance element is smaller than the length LFGmain1 of the first resistance region (LFGmain2<LFGmain2), even when the second resistance element 3-2 having a small resistance value is provided, the length of the second connection region LEI2 along the resistance direction of the resistance element is greater than the length of the first connection region LEI1 (LEI2>LEI1). In other words, when the second resistance element 3-2 including a resistance region with a small resistance value is used, the second connection region EI2 is extended in the length direction of the resistance element such that the contact area is increased.

In the present example, as in the above-described case, the widths of the first and second resistance regions 14-1 and 14-2 are common (equal) between the first and second resistance elements 3-1 and 3-2, and the widths and the number (one) of the first and second connection regions LEI1, LEI2 are common (equal).

Advantageous Effect

As described above, according to the semiconductor device of Modified Example 1, an advantageous effect including, but not limited to, and similar to (1) is obtained. In addition to that, an advantageous effect is obtained including, but not limited to the following (2):

(2) Effect of Variation in Resistance is Reduced, and Increase in Occupation Area is Suppressed.

As described above, when the second resistance element 3-2 with a small resistance value is applied, the contact area of the second connection region EI2 in the second resistance element 3-2 is increased with respect to the second resistance region 14-2 by the configuration in which the second connection region EI2 is longer than the first connection region EI1 in the resistance direction of the resistance element (LEI2>LEI1), and thereby the effect of the resistance value on the second resistance region 14-2 of the second connection region EI2 in the second resistance element 3-2 can be reduced.

Figure 4:
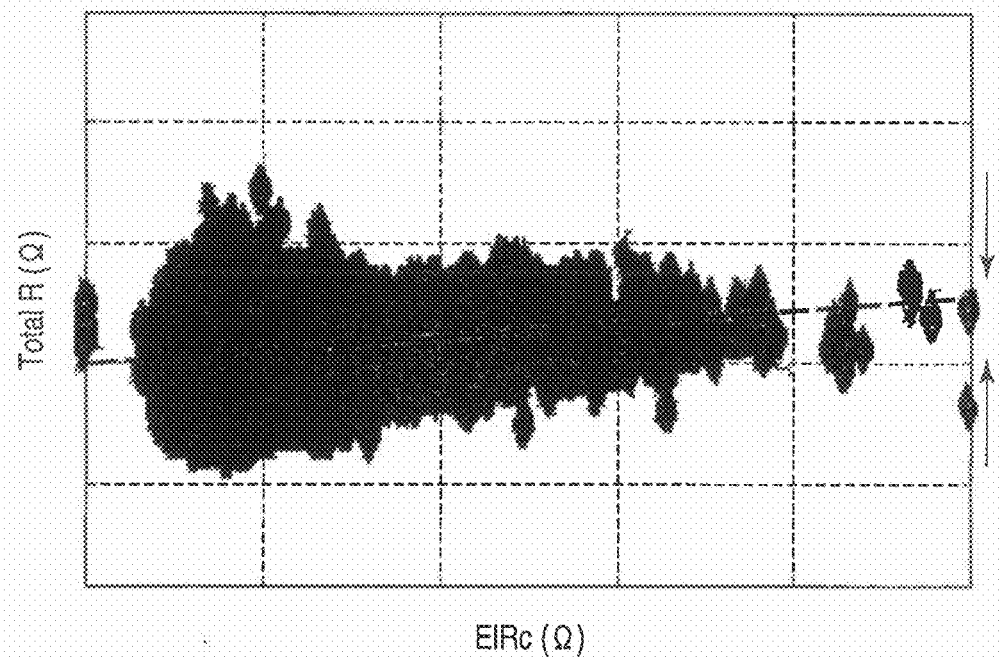
FIG. 4 illustrates relationship between a resistance value of an EI resistance portion and all the resistance values of an FG resistance portion.

Accordingly, as shown in FIG. 4, when the second resistance region 14-2 of the second resistance element 3-2 is small in the second direction, the effect of the total resistance value of the second connection region EI2 can be reduced by increasing the second connection region EI2 in the second direction.

As a result thereof, even when a resistance element 3-2 with a small resistance value is applied, since the resistance value and variation in resistance of the connection region 14-2 are reduced, the resistance elements 3-2 do not need to be arranged in parallel so as to suppress variation in resistance, in addition to not needing to separately design the total resistance value of the resistance element 3-2. This has an advantage in preventing increase in area of the semiconductor chip.

In a resistance element 3-1 with a large resistance value, the effect of the connection resistance due to the resistance value of the resistance element 3-1 is small. Accordingly, the length of the first connection region EI1 in the second direction does not need to be increased. It is thereby possible to prevent increase in area of the semiconductor chip.

Hereinafter, a more detailed configuration of the embodiment will be described with reference to the drawings, to which the first and second resistance elements 3-1 and 3-2 are applied. In the description that follows, the common structural elements will be referred to by the common referential marks throughout the drawings. It is to be noted that the drawings are merely in schematic form, and the relationship between the thickness and the plane dimensions, the ratio of the thickness of each layer and the like are different from actual ones.

[First Embodiment (NAND-Type Flash Memory)]

A semiconductor device according to the first embodiment will be described with reference to FIGS. 5-12. In this embodiment, a NAND-type flash memory will be taken as an example. In the description that follows, detailed description of structural elements overlapping with that described above will be omitted.

1. CONFIGURATION EXAMPLE

1-1. Overall Configuration Example

Figure 5:
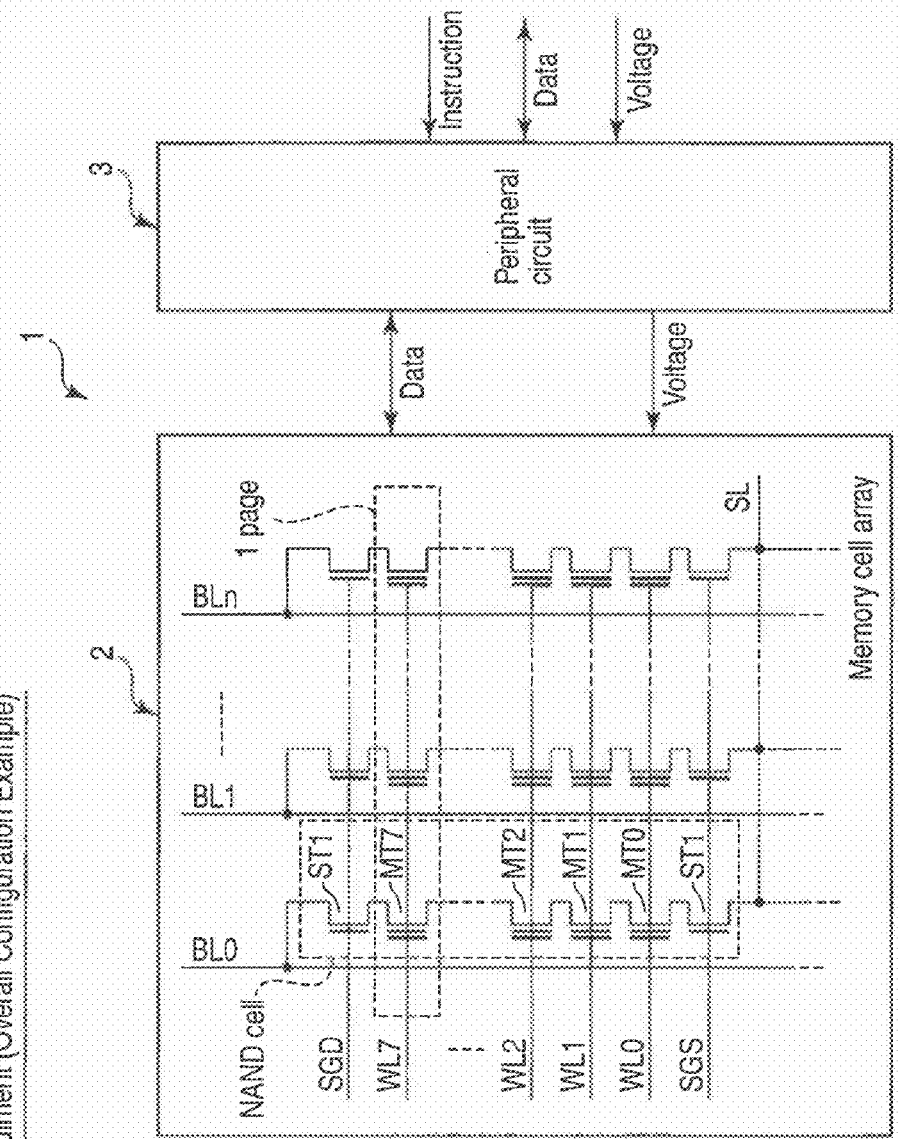
FIG. 5 is a block diagram illustrating a portion of a configuration of a NAND-type flash memory according to the first embodiment.

First, the overall configuration of the semiconductor device according to the first embodiment will be described with reference to FIG. 5. FIG. 5 is a block diagram illustrating part of a NAND-type flash memory according to the first embodiment.

As shown, the NAND-type flash memory 1 includes a memory cell array 2 and a peripheral circuit 3. Hereinafter, a configuration of the memory cell array 2 will be described.

1-2. Memory Cell Array

The memory cell array 2 includes a plurality of NAND cells. FIG. 5 shows NAND cells in only one line. Each of the NAND cells includes 8 memory cell transistors MT0-MT7, for example, and two selective transistors ST1, ST2. Hereinafter, the memory cell transistors MT0-MT7 will be simply referred to as memory cell transistor MT for the sake of simplicity, when they do not need to be distinguished from one another. The memory cell transistor MT has a stacked gate structure including a charge storage layer (such as a floating gate) formed on a semiconductor substrate so as to interpose a gate insulation film therebetween, and a control gate formed on the floating gate so as to interpose an inter-gate insulation film therebetween. The number of memory cell transistors MT is not limited to 8, and may be 16, 64, 128, 256, or the like. Adjacent memory cell transistors MT share the same source and drain. The memory cell transistors are provided such that the current paths are connected in series between the selective transistors ST1, ST2. A drain region of one end side of the memory cell transistors MT connected in series is connected to a source region of the selective transistor ST1, and the source region of the other end side is connected to a drain region of the selective transistor ST2. As in the memory cell transistor MT, the selective transistors ST1, ST2 also has a stacked gate structure. In the selective transistors ST1, ST2, however, the lower-layer gate and the upper-layer gate of the stacked gate structure are electrically connected since the inter-gate insulation film is removed in some region.

The control gates of the memory cell transistors MT in the same row are commonly connected to one of the word lines WL0-WL7, and the gates of the selective transistors ST1, ST2 of the memory cells in the same column are commonly connected to the select gate lines SGD, SGS, respectively. Although not shown in FIG. 5, a plurality of NAND cells are provided in the direction crossing the word lines WL0-WL7, and the drains of the selective transistors ST1 in the same column are commonly connected to one of the bit lines BL0-BLn (where n is a natural number). For the sake of simplicity, the word lines WL0-WL31 and the bit lines BL0-BLn will be hereinafter simply referred to as word line WL and bit line BL, respectively, when they do not need to be distinguished from one another. The sources of the selective transistors ST2 are commonly connected to the source line SL. It is to be noted that both of the selective transistors ST1, ST2 do not need to be provided, and only one of them may be provided as long as the NAND cell can be selected thereby.

In the above-described configuration, data is collectively written into the memory cell transistors MT connected to the same word line WL, which unit will be referred to as one page. Further, data is collectively erased from a plurality of NAND cells, which unit will be referred to as block. A block is formed of a group of NAND cells in the same row, i.e., a group of NAND cells connected to the same word line WL and select gate lines SGD, SGS.

1-3 Plan Configuration of Memory Cell Array

Figure 6:
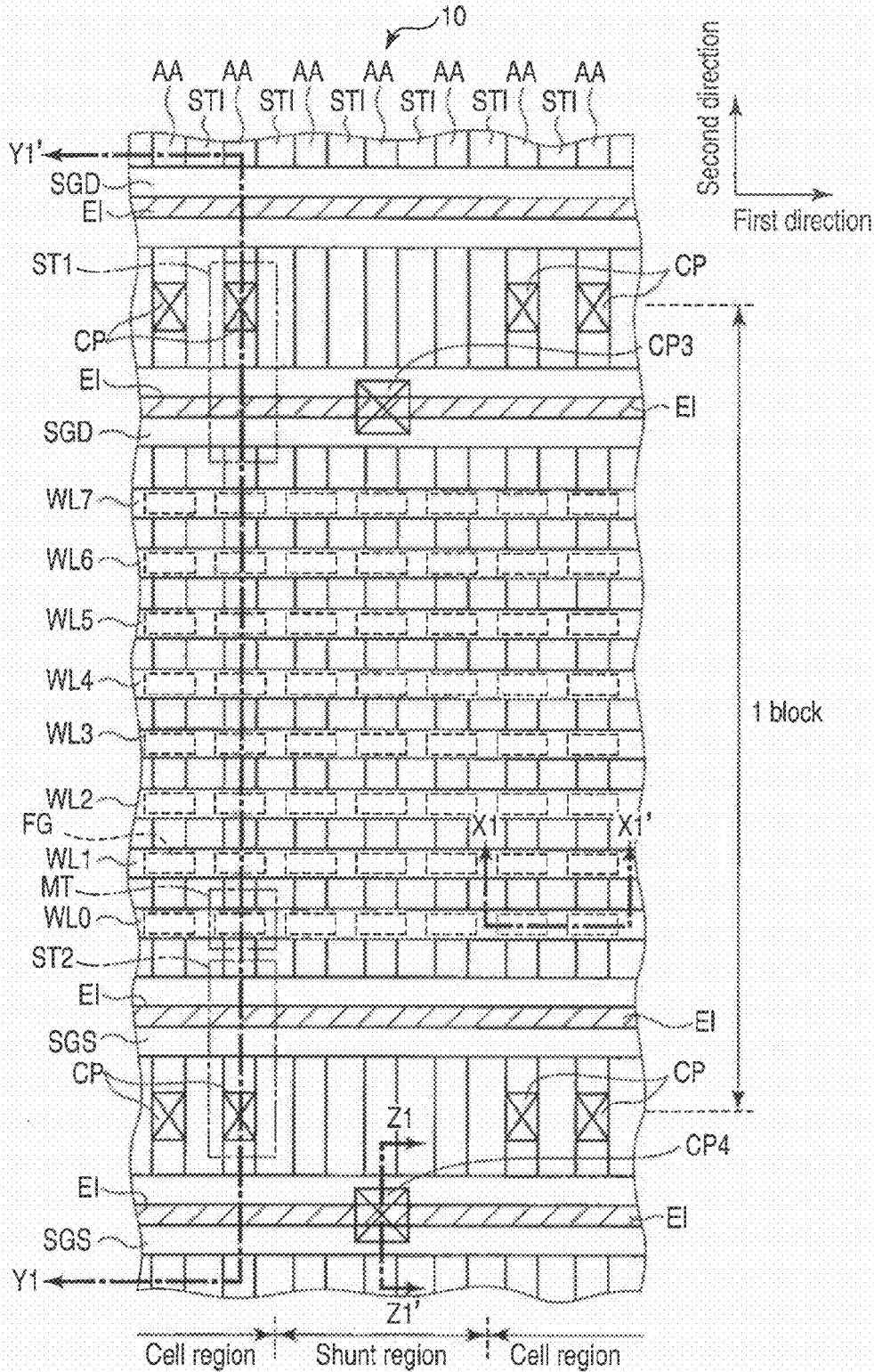
FIG. 6 is a plan view illustrating a plan configuration of a memory cell array according to the first embodiment.

Next, the plane configuration of the memory cell array 2 with the above-described configuration will be described with reference to FIG. 6.

As shown, the memory cell array 2 includes a cell region in which a NAND cell holding data is formed, and a shunt region to which gates of the selective transistors ST1, ST2 and a shunt wiring, which will be described below, are connected. The cell regions and the shunt regions are alternately arranged along the first direction on the semiconductor substrate surface.

In the semiconductor substrate 10 in the cell regions and the shunt regions, a plurality of striped element regions AA are formed along the second direction crossing the first direction. An element separation region STI is formed between adjacent element regions AA, and the element regions AA are electrically separated by the element separation region STI.

On the semiconductor substrate 10, the striped word line WL and the select gate line SGD, SGS are formed along the first direction, so as to straddle the element regions AA in the cell regions and the shunt regions. In a region of the cell region where the word line WL and the element region AA cross each other, a charge storage layer (floating gate FG) is provided. Further, a memory cell transistor MT is provided in a region where the word line WL and the element region AA cross one another, and selective transistors ST1, ST2 are provided in a region where the select gate lines SGD, SGS and the element area AA cross one another. An impurity diffusion layer, which becomes a source region or a drain region of the memory cell transistor MT and the selective transistors ST1, ST2, is formed between the word lines WL and the select gate lines adjacent to one another in the first direction, and in the element regions AA between the word line and the select gate line. A structure similar to that of the cell region is also provided in the shunt region, but the structure in the shunt region does not function as the memory cell transistor MT and the selective transistors ST1, ST2.

The impurity diffusion layer formed in the element region AA between the adjacent select gate lines SGD functions as a drain region of the selective transistor ST1. Further, a contact plug CP is formed on the drain region. The contact plug CP is connected to a striped bit line BL (not shown) formed along the second direction. The impurity diffusion layer formed in the element region AA between adjacent select gate lines SGS functions as a source region of the selective transistor ST2. A contact plug CP is formed on the source region. The contact plug CP is connected to a source line SL (not shown).

A connection region EI (Etching Inter-poly) is provided in the select gate lines SGD, SGS. The connection region EI is a region of the stacked gate structure of the selective transistors ST1, ST2, from which the inter-gate insulation film is removed, and the lower-layer gate and the upper-layer gate are connected via the connection region EI. The connection region EI has a rectangular shape, for example, along the first direction lengthwise.

In the shunt region, a contact plug CP is provided so as to be connected to each of the select gate lines SGD, SGS. Since the connection region EI will be provided in continuous in the shunt region as well, the contact plug CP is provided on the connection region EI of the select gate lines SGD, SGS. The contact plug CP is connected to each shunt wiring, not shown. The shunt wiring is a wiring via which a select signal in the row direction given from a row decoder is transmitted, and is formed of a wiring layer having a resistance lower than that of the stacked gate structure of the selective transistors ST1, ST2. By applying the select signal transmitted via the shunt wiring to the stacked gate structure of the selective transistors ST1, ST2 in the shunt region, a high-speed select operation is achieved.

1-4. Cross-sectional Configuration of Memory Cell Array

Figure 7:
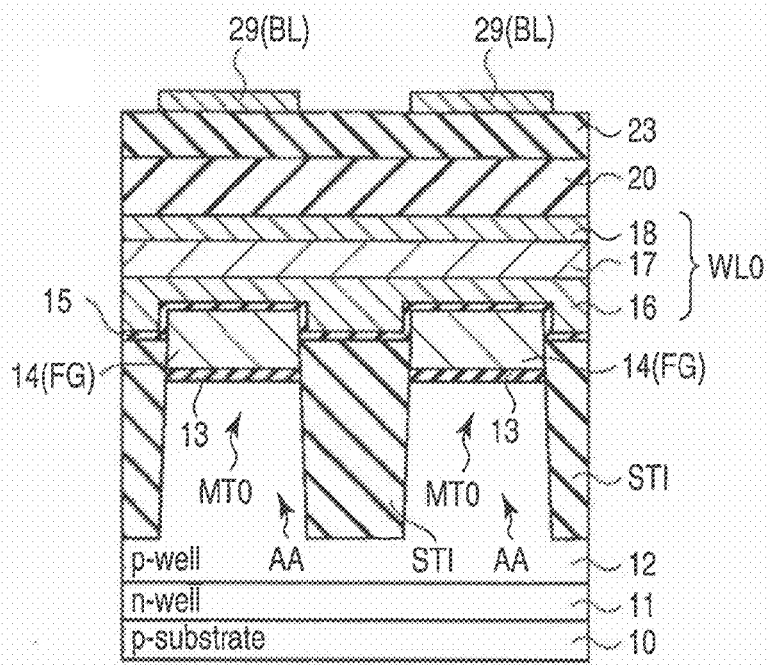
FIG. 7 is a cross-sectional view taken from line X1-X1' of FIG. 6, viewed along the arrow direction.
Figure 9:
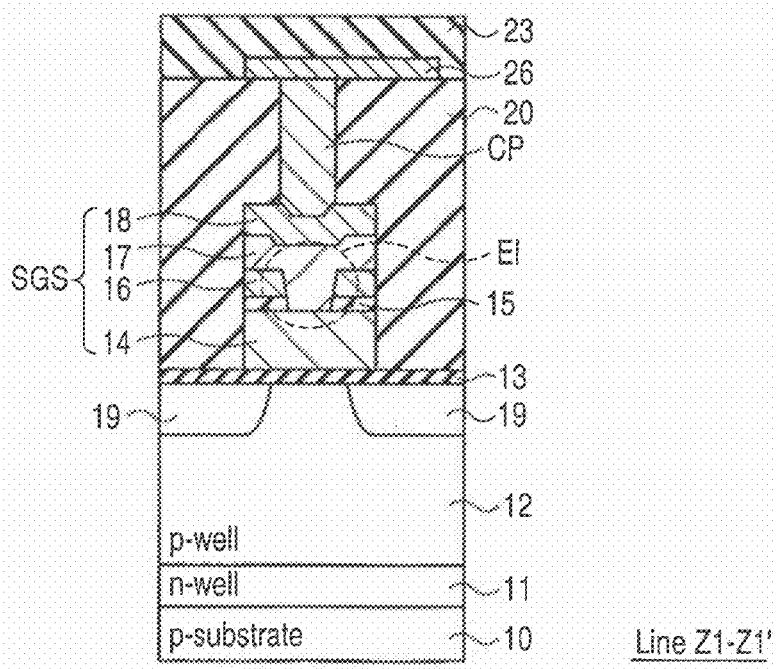
FIG. 9 is a cross-sectional view taken from line Z1-Z1' of FIG. 5, viewed along the arrow direction.
Figure 8:
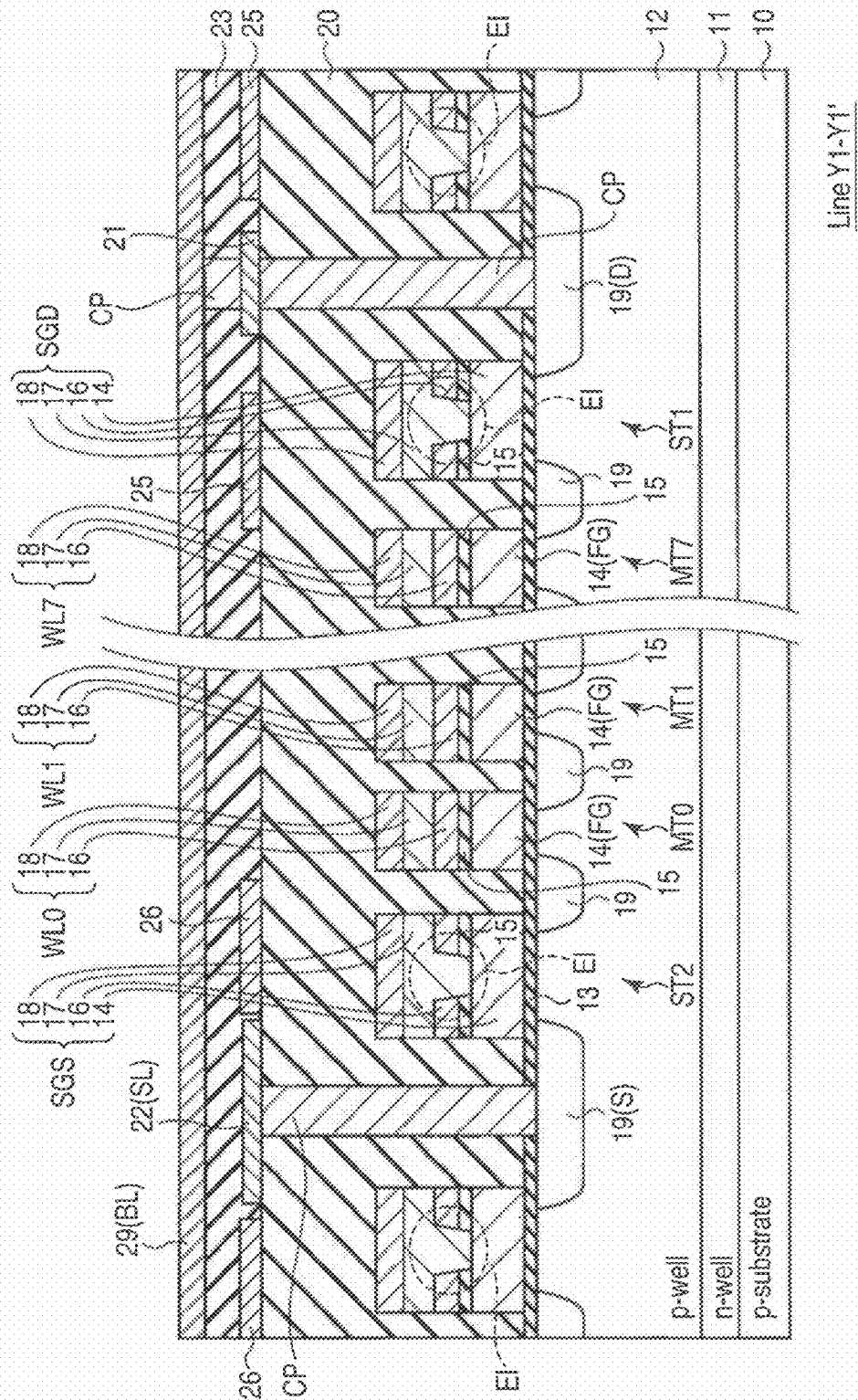
FIG. 8 is a cross-sectional view taken from line Y1-Y1' of FIG. 6, viewed along the arrow direction.

Next, a cross-sectional configuration of a NAND cell with the above-described configuration will be described with reference to FIGS. 7-9. FIGS. 7, 8, and 9 are cross-sectional views taken from lines X1-X1' (first direction), Y1-Y1' (second direction), and Z1-Z1' (second direction: contact plug on the contact region), respectively, of FIG. 6.

As shown, an n-type well region 11 is formed in the top surface region of the p-type semiconductor substrate 10, and a p-type well region 12 is formed in the top surface region of the n-type well region 11. Further, a plurality of striped element separation regions STI are formed along the second direction in the top surface of the n-type well region 12. The element separation region STI is formed of a groove formed in the well region 12 and an insulation film embedded in the groove. The region between the adjacent element separation regions STI becomes an element region AA.

A gate insulation film 13 is formed on the well region 12, which becomes the element region AA, and gate electrodes of a memory cell transistor MT and selective transistors ST1, ST2 are formed on the gate insulation film 13. Each of the gate electrodes of the memory cell transistor MT and the selective transistors ST1, ST2 includes a polycrystalline silicon layer 14 formed on the gate insulation film 13, an inter-gate insulation film 15 formed on the polycrystalline silicon layer 14, and polycrystalline silicon layers 16, 17 and a silicide layer 18 formed on the inter-gate insulation film 15. The inter-gate insulation film 15 is formed of a silicon oxide film, a stacked structure of a silicon oxide film and a silicon nitride film, or a stacked structure of a titanium oxide film, aluminum oxide film, a hafnium oxide film, and a silicon oxide film or a silicon nitride film, for example. The gate insulation film 13 of the memory cell transistor MT functions as a tunnel insulation film.

In the memory cell transistor MT, the polycrystalline silicon layer 14 is separated in the first direction by every memory cell transistor MT, and functions as a charge storage layer (such as a floating gate FG). On the other hand, the polycrystalline silicon layers 16, 17 and the silicide layer 18 adjacent to one another in the first direction are commonly connected, and function as a control gate (word line WL). That is, the polycrystalline silicon layers 16, 17 and the silicide layer 18 are formed so as to extend over the element regions AA, straddling the element separation region STI. It is to be noted that the upper surface of the element separation region STI is formed so as to be smaller in height than the upper surface of the polycrystalline silicon layer 14. Further, the inter-gate insulation film 15 is formed on a side surface of a region protruding from the top surface of the element separation region STI in the polycrystalline silicon layer 14.

In the selective transistors ST1, ST2, the polycrystalline silicon layers 16, 17 and the silicide layer 18 adjacent to one another in the word line direction are commonly connected. Further, the polycrystalline silicon layers 16, 17 and the silicide layer 18 functions as select gate lines SGS, SGD. In the selective transistors ST1, ST2, a connection region EI is formed. The connection region EI includes an opening portion formed by removing part of the inter-gate insulation film 15 and the polycrystalline silicon layer 16. Via the connection region EI, the polycrystalline silicon layer 14 and the polycrystalline silicon layers 16, 17 are connected.

The select gate lines SGD, SGS of the shunt portion have a configuration similar to that of the selective transistors ST1, ST2, but are different in that a contact plug CP is connected to the silicide layer 18 on the connection region EI.

In the top surface of the well region 12 positioned between the gate electrodes, an n-type impurity diffusion layer 19 is formed. The impurity diffusion layer 19 is shared between adjacent transistors, and functions as a source (S) or a drain (D). Further, the region between a source and a drain adjacent to each other functions as a channel region through which electrons move. The gate electrode, the impurity diffusion layer 19, and the channel region form a MOS transistor, which becomes the memory cell transistor MT and the selective transistors ST1, ST2.

On the semiconductor substrate 10, an inter-layer insulation film 20 is formed so as to coat the memory cell transistor MT and the selective transistors ST1, ST2. In the interlayer insulation film 20, a contact plug CP is formed so as to reach the impurity diffusion layer (source) 19 of the selective transistor ST2 on the source side. On the interlayer insulation film 20, a metal wiring layer 22 is formed and is connected to the contact plug CP. The metal wiring layer 22 functions as a source line SL. In the interlayer insulation film 20, a contact plug CP is formed so as to reach the impurity diffusion layer (drain) 10 of the selective transistor ST1 on the drain side. On the interlayer insulation film 20, a metal wiring layer 21 is formed and is connected to the contact plug CP. In the interlayer insulation film 20, a contact plug CP is formed so as to reach the gate electrode (silicide layer 18) of each of the selective transistors ST1, ST2. On the interlayer insulation film 20, metal wiring layers 25, 26 are formed and each is connected to the contact plug CP.

On the interlayer insulation film 20, an interlayer insulation film 23 is formed so as to coat the metal wiring layers 21, 22, 25, 26. In the interlayer insulation film 23, a contact plug CP6 is formed so as to reach the metal wiring layer 21. On the interlayer insulation film 23, a striped metal wiring layer 29 is formed along the second direction and is commonly connected to a plurality of contact plugs CP6. The metal wiring layer 29 is formed on the interlayer insulation film 23 so as to be positioned directly above the element region AA. The metal wiring layer 29 functions as a bit line BL, and the contact plug CP and the metal wiring layer 21 correspond to the contact plug CP in FIG. 6.

1-5. Peripheral Circuit

Next, a description will be given with reference to the peripheral circuit 3. The peripheral circuit 3 transmits and receives data to and from the memory cell array 2 and applies a voltage according to an instruction given from outside. The peripheral circuit 3 includes a row decoder, a sense amplifier, a voltage generation circuit, and a sequencer, for example.

The row decoder applies a voltage to the select gate lines SGD, SGS, and the word line WL connected to a corresponding block based on a row address RA given from outside during data writing, reading, and erasure operations. As described above, a voltage to be applied to the select gate lines SGD, SGS are also transmitted by the shunt wirings 25, 26.

The sense amplifier senses and amplifies data read from the memory cell transistor MT to the bit line BL during data reading operation. In this case, the sense amplifier senses a current flowing through the bit line BL. Alternatively, the sense amplifier senses a voltage of the bit line BL and thereby judges read data. During data writing operation, the sense amplifier transfers the write data to the bit line BL.

A voltage generation circuit generates a voltage to be applied to the word line WL during data writing operation, for example. The voltage generation circuit includes a resistance element configured to lower the voltage or a charge pump circuit configured to increase the voltage.

A sequencer executes a necessary operation sequence during data writing, reading, and erasure operations, and controls the operation of the row decoder, the sense amplifier, and the voltage generation circuit.

In the description that follows, a configuration of the resistance element included in the peripheral circuit 2 will be described. The resistance element can be used as the above-described resistance element configured to lower the voltage. As a matter of course, the purpose of the resistance element is not limited thereto and can be broadly used in the peripheral circuit 3.

1-6-1. Plan Configuration of Resistance Element

Figure 10:
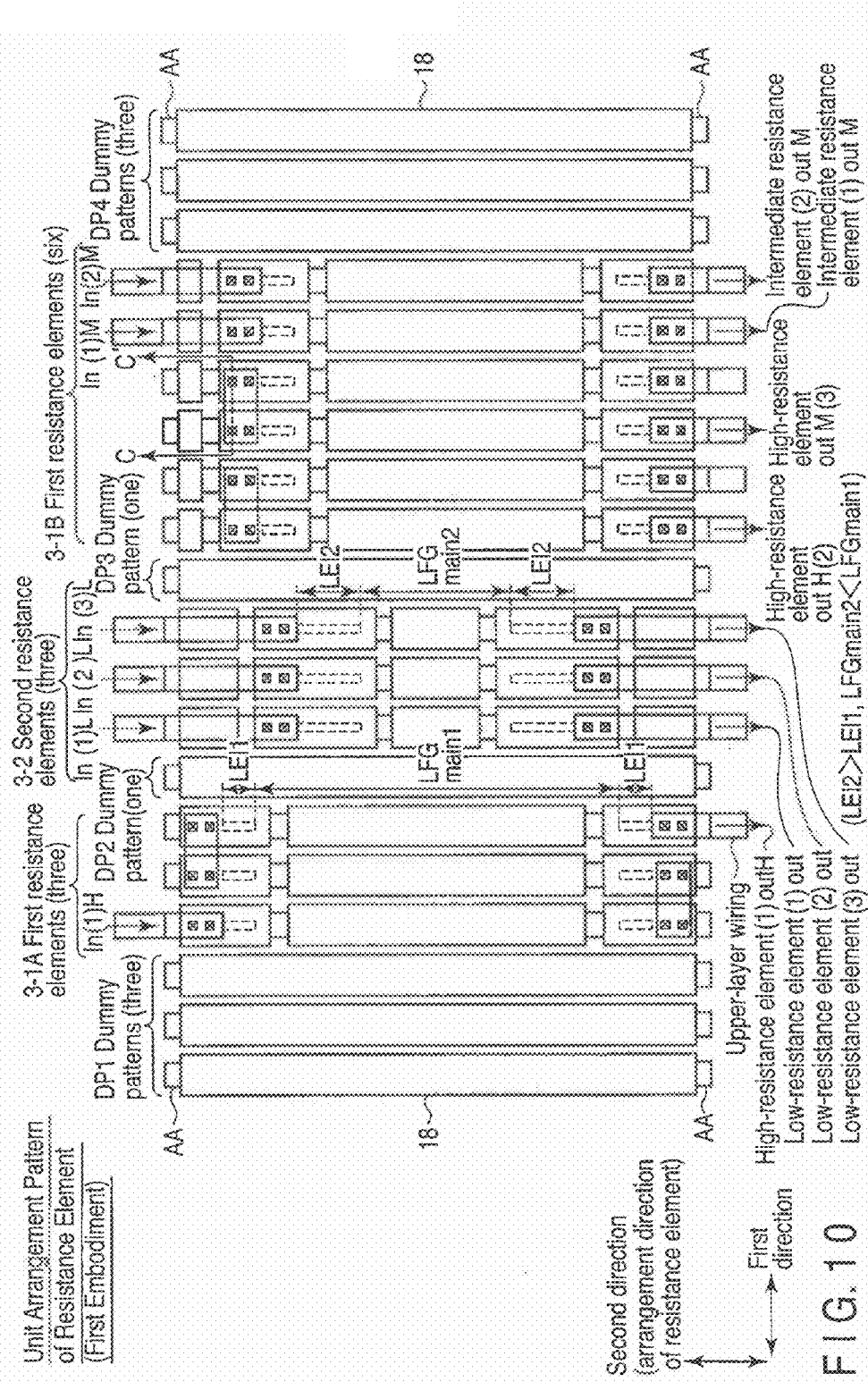
FIG. 10 is a plan view illustrating a unit arrangement pattern of a resistance element according to the first embodiment.

Next, the plan configuration of the resistance element will be described with reference to FIG. 10. FIG. 6 is a plan view of the resistance element. The resistance element is formed on the semiconductor substrate 10 same as that of the memory cell array of the above-described NAND-type flash memory. FIG. 10 shows a unit arrangement pattern of the resistance element according to the first embodiment. In the unit arrangement pattern of the resistance element according to the present embodiment, the first resistance element 3-1A, 3-1B, the second resistance element 3-2, and dummy patterns DP1-DP4 are handled as one unit.

The first and second resistance elements 3-1A, 3-1B, 3-2 have the same plan configuration as that of the above-described Modified Example 1. Further, an upper-layer wiring is electrically connected to the contact CP, and a desired resistance value of the present example is obtained. In the present example, three second resistance elements 3-2 are arranged between three first resistance elements 3-1A and 6 first resistance elements 3-1B.

Since the dummy patterns DP1-DP4 are used as dummies, a contact wiring or a connection region are not formed therein. Other than that, the cross-sectional configuration of the dummy patterns DP1-DP4 are the same as that of the first and second resistance elements 3-1, 3-2. In other words, the dummy patterns DP1-DP4 include a fifth conductive material 14 provided on the semiconductor substrate 10, the inter-gate insulation film 15 formed on the fifth conductive material 14, and a sixth conductive material 16-18 formed on the inter-gate insulation film 15.

In the present embodiment, three dummy patterns DP1, DP4 are arranged around the external periphery of the unit arrangement pattern of the resistance element. One dummy pattern DP2 is arranged between the first resistance element 3-1A and the second resistance element 3-2. One dummy pattern DP3 is arranged between the first resistance element 3-1B and the second resistance element 3-2.

Further, the first and second resistance elements 3-1A, 3-1B, 3-2 are arranged with periodicity. That is, the lengths of the first and second resistance elements 3-1A, 3-1B, 3-2 in the first direction are approximately equal. Further, the first and second resistance elements 3-1A, 3-1B, and 3-2 are arranged at approximately equal intervals in the first direction.

<Resistance Value to be Obtained>

In the three first resistance elements 3-1A, contacts on the input side and the output side are electrically connected by the upper-layer wiring, and thereby a resistance is directly formed. Accordingly, in the present embodiment, a current that flows from the input side (In (1) H) to the output side (out (1) H) flows through a high-resistance element (1) formed by connecting the three first resistance elements 3-1A in series.

In the six first resistance elements 3-1B, only 2 contacts×2 and 1 contact×2 on the input side and the output side are electrically connected by the upper-layer wiring, and thereby 3 direct resistances and 1 direct resistance are formed. Accordingly, in the present embodiment, a current that flows from the input side (In (1) M) to the output side (out (2) H), (out (1) M) flows through a high-resistance element (2) formed by connecting the three first resistance elements 3-1B in series and a medium-resistance element (1) of one first resistance element 3-1B. Similarly, a current that flows from the input side (In (2) M) to the output side (out (3) H), (out (2) M) flows through a high-resistance element (3) formed by connecting the three first resistance elements 3-1B in series and an intermediate resistance element (2) of one first resistance element 3-1B.

The three second resistance elements 3-2 are electrically connected via an upper-layer wiring and thereby one direct resistance is formed. Accordingly, in the present example, a current that flows from the input side (In (1) L) to (In (3) L) to the output side (out (1) L) to (out (3) L) flows through the low-resistance elements (1)-(3) formed of one second resistance element 3-2.

It is to be noted that the connection relation shown in the present embodiment is merely an example, and the number of resistance elements, the resistance value of each resistance element, and arrangement of the dummy pattern DP may be varied as necessary, as a matter of course. For example, the first resistance element 3-1A and the second resistance element 3-2 may be arranged so as to be directly adjacent to one another, without via a dummy pattern.

1-6-2. Cross-sectional Configuration of Resistance Element

Figure 11:
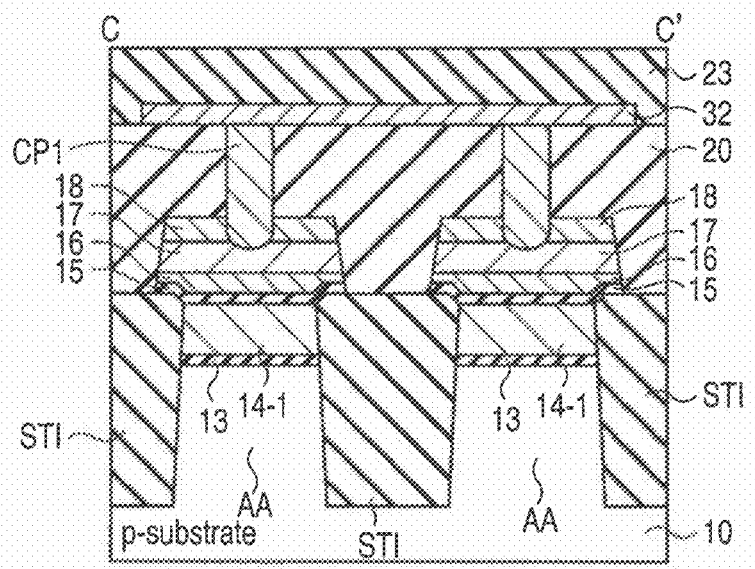
FIG. 11 is a cross-sectional view along line C-C' of FIG. 10, viewed along the arrow direction.

Next, the cross-sectional configuration of the resistance element with the above-described configuration will be described with reference to FIGS. 11, 12A, and 12B. FIG. 11 is a cross-sectional view along line C-C' of FIG. 10, viewed along the arrow direction (first direction). FIGS. 12A, 12B are cross-sectional views along the direction (second direction) same as that of FIG. 2.

As shown, a polycrystalline silicon layer 14 is formed on each of the element regions AA via the gate insulation film 13. Polycrystalline silicon layers 16, 17 and the silicide layer 18 are sequentially formed on the polycrystalline silicon layer 14 via the inter-gate insulation film 15. Hereinafter, the polycrystalline silicon layer 14 in the first resistance element may be referred to as a first conductive material 14-1, and the polycrystalline silicon layer 14 in the second resistance element may be referred to as a first conductive material 14-2.

As described above, in each of the element regions AA, the integrate insulation film 15, the polycrystalline silicon layers 16, 17, and the silicide layer 18 are divided into three regions along the second direction. For example, in the first resistance element 3-1, a groove is formed between the regions A1-1 and A2-1 and the regions A2-1 and A3-1 by removing the polycrystalline silicon layers 16, 17 and the silicide layer 18. Similarly, in the second resistance element, a groove is formed between the regions A1-2 and A2-2 and the regions A2-2 and A3-2 by removing the polycrystalline silicon layers 16, 17 and the silicide layer 18. In FIG. 2, the upper surface of the element separation region STI is formed at a height greater than the upper surface of the polycrystalline silicon layer 14, but the upper surface of the element separation region STI may be formed at a height smaller than the upper surface of the polycrystalline silicon layer 14.

The first and second conductive materials 14-1, 14-2 are formed simultaneously with the polycrystalline silicon layer 14. Further, the polycrystalline silicon layers 16, 17 and the silicide layer 18 are formed simultaneously with the polycrystalline silicon layers 16, 17 of the memory cell transistor MT and the selective gate transistors ST1, ST2, and the silicide layer 18, via the inter-gate insulation film 15 in the first and second resistance elements 3-1, 3-2.

A first connection portion EI1 is formed in the regions A1-1, A3-1. In the first connection portion EI1, an opening portion is formed by removing part of the inter-gate insulation film 15 and the polycrystalline silicon layer 16, and thereby the polycrystalline silicon layer 14 and the polycrystalline silicon layer 17 are connected. Similarly, the second connection portion EI2 is formed in the regions A1-2, A3-2.

The first and second connection portions EI1, EI2 may be formed simultaneously with the connection region EI of the select gate lines SGD, SGS. In that case, the manufacturing process can be simplified.

In the second connection portion EI2, an opening portion is formed by removing part of the inter-gate insulation film 15 and the polycrystalline silicon layer 16, and thereby the polycrystalline silicon layer 14 and the polycrystalline silicon layer 17 are connected. In this case, the length LEI2 of the second connection region along the second direction is greater than the length LEI1 of the first connection region (LEI2>LEI1). Further, as in the above-described case, the width WEI2 of the first connection region along the first direction is approximately the same as the width WEI1 of the first connection region (WEI2 WEI1).

An interlayer insulation film 20 is formed on the semiconductor substrate 10 so as to coat the resistance elements 3-1A, 3-2. A contact plug CP1 is formed in the inter-layer insulation film 20 so as to reach the silicide layer 18 in the regions A1-1, A3-1, and a contact plug CP2 is formed so as to reach the silicide layer 18 in the regions A1-2, A3-2. Metal wiring layers 31, 32 are formed on the interlayer insulation film 20. The metal wiring layer 31 is connected to the contact plugs CP1, CP2 in the regions A3-1, A3-2, and the metal wiring layer 32 is connected to the contact plugs CP1, CP2 in the regions A1-1, A1-2.

In the above-described configuration, the region in which the polycrystalline silicon layer 14 substantially functions as a resistance in the resistance element will be referred to as a first resistance region LFG1 and a second resistance region LFG2. That is, the first resistance region LFG1 is a region from the end portion of the first connection region EI1 on the region A2-1 side in the region A1-1 to the end portion of the first connection region EI1 on the region A2-1 side in the region A3-1, with respect to the second direction. Similarly, the second resistance region LFG2 is a region from the end portion of the second connection region EI2 of the region A2-2 in the region A1-2 to the end portion of the second connection region EI2 of the region A2-2 in the region A3-2, with respect to the second direction.

Further, the polycrystalline silicon layers 16, 17 and the silicide layer 18 in the regions A1-1, A1-2, A3-1, and A3-2 function as an electrode in the resistance element. The polycrystalline silicon layers 14, 16, 17 and the silicide layer 18 may be any conductive layer, and is formed of the material same as that of the memory cell array.

As described above, the present embodiment is the same as the above-described configuration in that, in the first and second resistance elements 3-1A, 3-1B, 3-2, the second connection region EI2 is greater in length than the first connection region EI1 (LEI2>LEI1) in the direction in which the resistance element is arranged, and the length LFGmain2 of the second resistance region is smaller than the length LFGmain1 of the first resistance region (LFGmain2<LFGmain1). Among the first and second resistance elements 3-1A, 3-1B and 3-2, the widths of the first and second resistance regions 14-1, 14-2 are common (equal), and the widths and the number (one) of the first and second connection regions LEI1, LEI2 are common (same).

The polycrystalline silicon layers 14-1, 14-2, 16, 17, and the silicide layer 18 may be any conductive material, and is integrally formed with the memory cell array using the same material.

2. Advantageous Effect

According to the semiconductor storage device of the first embodiment, advantageous effects similar to those of (1) and (2) are obtained. Further, various applications may be made as necessary, such as a NAND-type flash memory as exemplified in the present example.

For example, in the three first resistance elements 3-1A, the contacts of both the input side and the output side are electrically connected via the upper-layer wiring, and thereby a direct resistance is formed. Accordingly, in the present example, a current that flows from the input side (In (1) H) to the output side (out (1) H) flows through the high-resistance element (1) connected in series of the three first resistance element 3-1A.

In the six first resistance elements 3-1B, only 2×2 and 1×2 contacts of both the input side and the output side are electrically connected via the upper-layer wiring, and thereby three and one direct resistances are formed. Accordingly, in the present example, the current that flows from the input side (In(1)M) to the output side (out(2)H), (out(1)M) flows through the high-resistance element (2) connected in series of the three first resistance elements 3-1B and the medium-resistance element (1) of one first resistance element 3-1B. Similarly, the current that flows from the input side (In(2)M) to the output side (out(3)H), (out(2)M) flows through the high-resistance element (3) connected in series of the three first resistance elements 3-1B and the medium-resistance element (2) of one first resistance element 3-1B.

In each of the three second resistance elements 3-2, one direct contact is formed by being electrically connected via the upper-layer wiring. Accordingly, in the present example, the current that flows from the input side (In(1)L)-(In(3)L) to the output side (out(1)L)-(out(3)L) flows through the low-resistance elements (1)-(3) of one second resistance element 3-2.

In NAND-type flash memory, there is tendency to shrink the memory cell transistor MT in size for miniaturization and increased in capacity. That is, there is a trend to decrease the height of the charge storage layer and increase the impurity concentration of the impurities (N-type impurities when the semiconductor substrate is P-type). Accordingly, variation in resistance value of the resistance element tends to increase due to miniaturization of the NAND-type flash memory. As a result thereof, the advantageous effects of (1) and (2) are becoming more prominent.

The first and second resistance elements 3-1A, 3-1B and 3-2 are arranged with periodicity in the first direction. That is, the lengths of the first and second resistance elements 3-1A, 3-1B, and 3-2 are approximately equal. Further, the first and second resistance elements 3-1A, 3-1B, and 3-2 are arranged at approximately equal intervals in the first direction.

That is, it is not preferable to increase the length of the second conductive material 14-2 in the first direction in the interest of decreasing the resistance value of the second resistance element 3-2, because it may destroy the periodicity of the first and second resistance elements 3-1A, 3-1B and 3-2.

On the other hand, the lengths of the first resistance elements 3-1A, 3-1B in the first direction need to be decreased so as to increase the resistance value of the first resistance elements 3-1A, 3-1B. As a result thereof, the length of the second resistance element 3-2 in the first direction decreases, and the resistance value needs to be decreased by decreasing the length in the second direction. For that reason, the length of the connection region of the second resistance element 3-2 in the first direction cannot be increased either.

According to the present embodiment, it is possible to reduce the effect of the resistance value of the connection region 14-2 of the resistance element 3-2 or variation in resistance by increasing the length of the second resistance element 3-2 connection region in the second direction. Further, an advantage is obtained in that since the resistance elements 3-2 do not need to be arranged in parallel so as to suppress variation in resistance, the area of the semiconductor chip can be prevented from increasing.

Further, in the resistance element 3-1 having a high resistance value, the effect of the connection resistance by the resistance value of the resistance element 3-1 is small. Accordingly, the length of the first connection region EI1 in the second direction does not need to be increased. Accordingly, the area of the semiconductor chip is prevented from increasing. Further, the length of the second resistance element 3-2 in the second direction is smaller than the length of the first resistance element 3-1 in the second direction. Accordingly, the length of the unit arrangement pattern of the resistance element in the first direction is determined by the first resistance element 3-1. That is, by making the first resistance element 3-1 small in the first direction, the area of the unit arrangement pattern of the resistance element can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   a first resistance element including a first conductive material provided on the semiconductor substrate, an inter-gate insulation film formed on an upper surface of both ends of the first conductive material in a first direction, and a second conductive material formed above the first conductive material and configured to connect with the first conductive material via a first connection region from which the inter-gate insulation film is removed; and
   a second resistance element including a third conductive material provided on the semiconductor substrate, the inter-gate insulation film formed on an upper surface of both ends of the third conductive material in the first direction, and a fourth conductive material formed above the third conductive material and configured to connect with the third conductive material via a second connection region from which the inter-gate insulation film is removed, wherein
   a length of the second connection region is greater than a length of the first connection region in the first direction.

2. The device of claim 1, wherein the first resistance element has first connection regions and the second resistance element has second connection regions, and wherein a length between the second connection regions is smaller than a length between the first connection regions in the first direction.

3. The device of claim 1, wherein a width of the first conductive material and a width of the third conductive material are common in a second direction crossing the first direction.

4. The device of claim 3, wherein the first and second resistance elements are arranged at equal intervals in the second direction.

5. The device of claim 1, further comprising a memory cell array in which a plurality of memory cells are provided,
wherein the first conductive material and the third conductive material are formed of a material same as a material of a charge storage layer of the memory cell.

6. The device of claim 5, wherein the first and second resistance elements are arranged in a peripheral circuit of the memory cell array.

7. The device of claim 5, further comprising a dummy pattern including a fifth conductive material provided on the semiconductor substrate, the inter-gate insulation film formed on the fifth conductive material, and a sixth conductive material formed on the inter-gate insulation film.

8. A semiconductor device comprising:
a semiconductor substrate;
a memory cell array including a plurality of memory cell arrays arranged on the semiconductor substrate;
a peripheral circuit of the memory cell array;
a first resistance element arranged in the peripheral circuit and including a first conductive material provided on the semiconductor substrate, an inter-gate insulation film formed on an upper surface of both ends of the first conductive material in a first direction, and a second conductive material formed above the first conductive material and configured to connect with the first conductive material via a first connection region from which the inter-gate insulation film is removed; and
a second resistance element arranged in the peripheral circuit and including a third conductive material provided on the semiconductor substrate, the inter-gate insulation film formed on an upper surface of both ends of the third conductive material in the first direction, and a fourth conductive material formed above the third conductive material and configured to connect with the third conductive material via a second connection region from which the inter-gate insulation film is removed, wherein
a length of the second connection region is greater than a length of the first connection region in the first direction.

9. The device of claim 8, wherein the length of between the second connection regions is smaller than the length of between the first connection regions in the first direction.

10. The device of claim 8, wherein a width of the first conductive material and a width of the third conductive material are common in a second direction crossing the first direction.

11. The device of claim 10, wherein the first and second resistance elements are arranged at equal intervals in the second direction.

12. The device of claim 8, wherein the first conductive material and the third conductive material are formed of a material same as a material of a charge storage layer of the memory cell.

13. The device of claim 8, further comprising a dummy pattern including a fifth conductive material provided on the semiconductor substrate, the inter-gate insulation film formed on the fifth conductive material, and a sixth conductive material formed on the inter-gate insulation film, and arranged in the peripheral circuit.

* * * * *